United States Patent [19]
Komori et al.

[11] Patent Number: 5,481,227
[45] Date of Patent: Jan. 2, 1996

[54] OSCILLATOR, SYNTHESIZER TUNER CIRCUIT AND AM SYNCHRONOUS DETECT CIRCUIT EMPLOYING THE OSCILLATOR

[75] Inventors: Kenji Komori; Atsushi Hirabayashi, both of Tokyo, Japan

[73] Assignee: Sony Corporation, Tokyo, Japan

[21] Appl. No.: 391,065

[22] Filed: Mar. 21, 1995

[51] Int. Cl.[6] ............... H03B 5/36; H03D 1/00; H03D 3/00; H03L 7/16
[52] U.S. Cl. ............... 331/2; 331/8; 331/18; 331/23; 331/36 C; 331/45; 331/158; 331/177 V; 329/325; 329/326; 329/360; 327/105; 455/260; 455/318; 455/337
[58] Field of Search ............... 331/2, 8, 18, 23, 331/36 C, 45, 46, 48, 55, 116 R, 116 FE, 158, 177 R, 177 V; 329/325, 326; 332/117, 127; 327/105, 238, 254, 255; 455/164.1, 164.2, 165.1, 260, 318, 337

[56] References Cited

U.S. PATENT DOCUMENTS

| | | | |
|---|---|---|---|
| 2,245,627 | 6/1941 | Varian | 331/2 |
| 3,177,442 | 4/1965 | Halverson | 331/2 |
| 4,131,861 | 12/1978 | Malaviya | 331/2 |
| 4,234,929 | 11/1980 | Riley, Jr. | 331/2 X |

FOREIGN PATENT DOCUMENTS

| | | | |
|---|---|---|---|
| 0588739 | 12/1959 | Canada | 331/2 |
| 0823819 | 11/1959 | United Kingdom | 331/2 |

*Primary Examiner*—David Mis
*Attorney, Agent, or Firm*—Jay H. Maioli

[57] ABSTRACT

An oscillator capable of setting a desired frequency by using only two resonators without setting up any additional adjustment processes, and a synthesizer tuner circuit with an AM synchronous detect circuit. The oscillator comprises: a first oscillator oscillating at a desired frequency as a result of inputting a voltage from a parallelly-connected first resonator and first voltage-variable capacitor to a current feedback loop of a first amplifier and controlling a voltage applied to the first voltage-variable capacitor; a second oscillator oscillating at a desired frequency as a result of inputting a voltage from a parallelly-connected second resonator and second voltage-variable capacitor to a current feedback loop of a second amplifier and controlling a voltage applied to the second voltage-variable capacitor; a voltage generator for generating a voltage to be applied to the first voltage-variable capacitor and a voltage to be applied to the second voltage-variable capacitor by comparing outputs from the first and second oscillators; and a controller for making oscillating frequencies for the first and second oscillators coincide in a phase-locked loop constructed so that the polarities of the voltages applied to the first and second voltage-variable capacitors are different.

12 Claims, 8 Drawing Sheets

5,481,227

OSCILLATOR, SYNTHESIZER TUNER CIRCUIT AND AM SYNCHRONOUS DETECT CIRCUIT EMPLOYING THE OSCILLATOR

BACKGROUND OF THE INVENTION

1. Field of the Invention

The present invention relates to an oscillator for outputting signals having a plurality of different frequencies and a synthesizer tuner circuit and AM synchronous detect circuit using this oscillator.

2. Description of the Related Art

Reference frequency oscillators used in synthesizer tuner circuits and PLL (Phase Locked Loop) synchronous detectors for televisions, radio tuners and portable communications employ resonators such as crystal or ceramic resonators which are produced on a production line without adjustment.

This construction is shown in FIG. 9. Here, a voltage vo is converted to a current i1 by a voltage/current converter 41. This current i1 is fed into the desired resonator from within the n resonators X1 to Xn inside a resonator group 44 by making a selection with the switch 43. A voltage v1 is generated at the maximum amplitude for the oscillating frequency of the resonator at a phase difference of zero degrees and this is input to the amplifier 42. An oscillating loop can then be formed by taking the output voltage vo for the amplifier 42 as the input for the voltage current converter 41. The oscillating frequency of the resonator is taken as the reference oscillating frequency output.

In this way, in the case where a plurality of reference frequencies are necessary to maintain compatibility in countries and regions where intermediate frequencies differ, as with multi-system compatible televisions, only a number of resonators equal to the number of required frequencies are prepared. The oscillating frequency is then set up by making selections with the switch 43.

However, the reference frequency generators for the synthesizer tuner circuits and PLL synchronous detectors (AM synchronous detect circuits, FM synchronous detectors) used in televisions, radio tuners and portable communications are the most important elements with regards to deciding the performance and the circuit scale of the device.

Also, there is a pressing need to develop highly integrated, high performance IC's to achieve the substantial improvements in compact, lightweight, low cost circuit elements needed today. However, retaining the numerous functions which are required make this difficult. In addition to retaining performance when putting the reference frequency oscillator into integrated circuit form, there are also problems encountered in simplifying the peripheral circuits and reducing the number of adjustment processes.

With conventional reference frequency oscillators, a plurality of reference frequencies can be obtained without setting up the above-mentioned adjustment processes afresh. However, if a large number of reference frequencies become necessary, then the number of resonators is also increased. This will increase both the circuit scale and the parts costs. As the cost of the resonators increases with resonator precision, increasing the number of resonators has an extremely detrimental effect.

It is therefore not possible to construct a reference frequency oscillator using resonators which have a high performance and do not require adjustments in the manufacturing process without both the circuit scale and the parts costs being high. This means that IC circuits which combine high integration, high performance and low costs cannot be obtained.

The present invention has been made to resolve the above-mentioned problems and an object of the invention is to provide an oscillator, and a synthesizer tuner circuit and an AM synchronous tuner employing this oscillator, which uses only two resonators, does not require the setting up of any new adjustment processes and for which arbitrary frequencies can be set up.

SUMMARY OF THE INVENTION

In order to resolve the aforementioned problems, the oscillator according to the present invention comprises a first oscillator oscillating at a desired frequency as a result of inputting a voltage from a parallelly-connected first resonator and first voltage-variable capacitor to a current feedback loop of a first amplifier and controlling a voltage applied to the first voltage-variable capacitor, a second oscillator oscillating at a desired frequency as a result of inputting a voltage from a parallelly-connected second resonator and second voltage-variable capacitor to a current feedback loop of a second amplifier and controlling a voltage applied to the second voltage-variable capacitor, a voltage generator for generating a voltage to be applied to the first voltage-variable capacitor and a voltage to be applied to the second voltage-variable capacitor by comparing an output of the first oscillator and an output of the second oscillator and controller for making an oscillating frequency of the first oscillator and an oscillating frequency of the second oscillator coincide in a phase-locked loop constructed in such a manner that the polarities of the voltages applied to the first and second voltage-variable capacitors are different.

The oscillating frequency of the oscillator can therefore be variably controlled by varying the control coefficient of the voltage applied to the second voltage-variable capacitor. Further, a synthesizer/tuner circuit of this invention is characterized by the provision of the oscillator, a frequency synchronous loop circuit for generating a signal which is frequency synchronous with the output of the oscillator, and a frequency converter for frequency converting the RF input based on the output from the frequency synchronous loop circuit.

The AM synchronous detect circuit of this invention is characterized by the provision of the oscillator, a PLL circuit which operates in such a manner that the phase of the output of the second oscillator in the oscillator and the phase of a wave modulated input coincide, and an AM detector for detecting the wave modulated input in accordance with the output of the first oscillator in the oscillator.

Compatibility with a plurality of frequencies can be attained using only two resonators and components other than the resonators can all be built into the same circuitry. This means that both the circuit scale and the parts costs can be reduced.

Also, a frequency can be set up by selecting a control coefficient of the voltage control coefficient circuit. A number of adjustment processes are therefore not necessary and the production costs can be reduced accordingly.

Further, circuit scale and parts costs can again both be reduced by using the oscillator of this invention in an AM synchronous detect circuit.

DETAILED DESCRIPTION OF THE PREFERRED EMBODIMENTS

Embodiment

Figure 1:
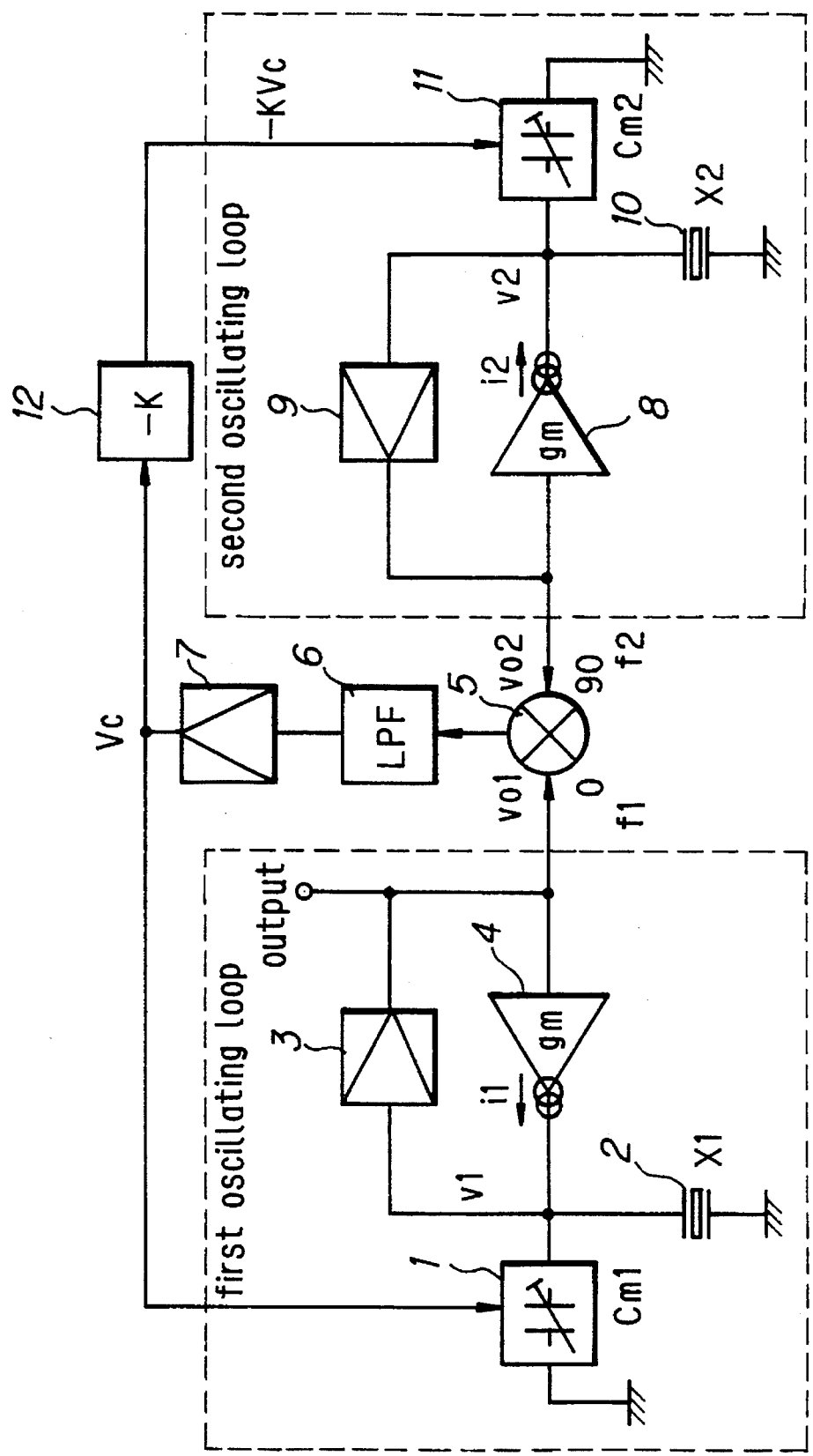
FIG. 1 is a block diagram showing the structure of a first embodiment of an oscillator according to one embodiment of the present invention.

The following is a detailed description of an embodiment of the present invention with reference to the diagrams. FIG. 1 is a block diagram of an oscillator according to one embodiment of this invention. In this oscillator, a PLL (phase locked loop) is constructed so that the oscillating frequencies for a first oscillating loop and a second oscillating loop are equal.

Figure 2A:
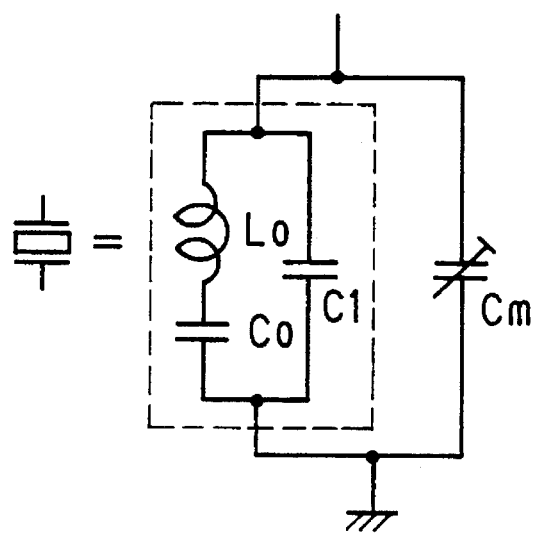
FIG. 2A and 2B is a view showing an equalization circuit and impedance when a resonator and a voltage-variable capacitor are connected in parallel.
Figure 2B:
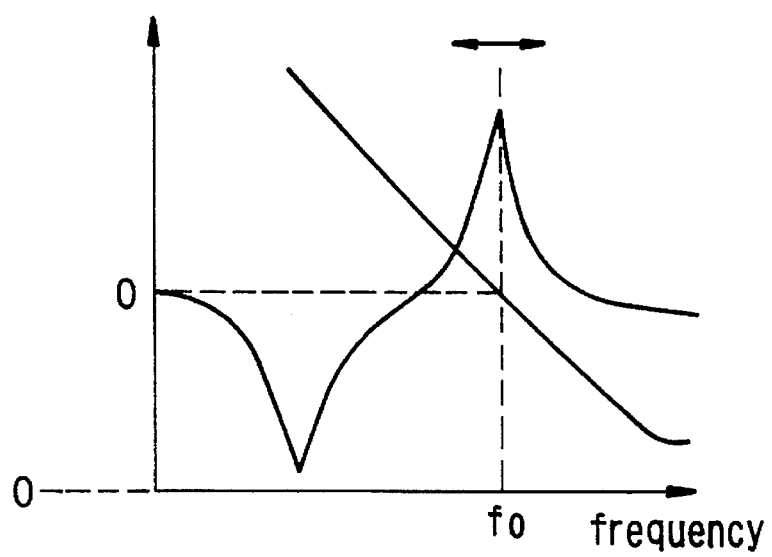

In the first oscillating loop, an output current i1 for a voltage/current converter 4 flows into an impedance circuit constructed from a voltage-variable capacitor 1 and a resonator 2 connected in parallel and a resonance voltage v1 is obtained. The impedance when the resonator 2 and the voltage-variable capacitor 1 are in parallel is shown in FIG. 2. That is, a variable capacitor Cm is put in parallel with C1 in the evaluation circuit for the resonator so that the resonant frequency f1 of the impedance at the maximum oscillation with zero phase-difference is expressed by:

$$f1 = \frac{1}{2\pi} \sqrt{ \left\{ \frac{1}{L_0} \left( \frac{1}{C_0} + \frac{1}{C_1 + C_m} \right) \right\} } \quad (1)$$

This varies in accordance with the variations of Cm.

In this way, the resonant voltage v1 which occurs at the resonant frequency f1 is determined and an oscillating loop is formed so that the gain necessary for the oscillations from the oscillator 3 is compensated for, the output voltage vo1 is taken out and then re-input to the voltage/current converter 4 so that the resonant frequency f1 becomes the oscillating frequency.

Figure 3:
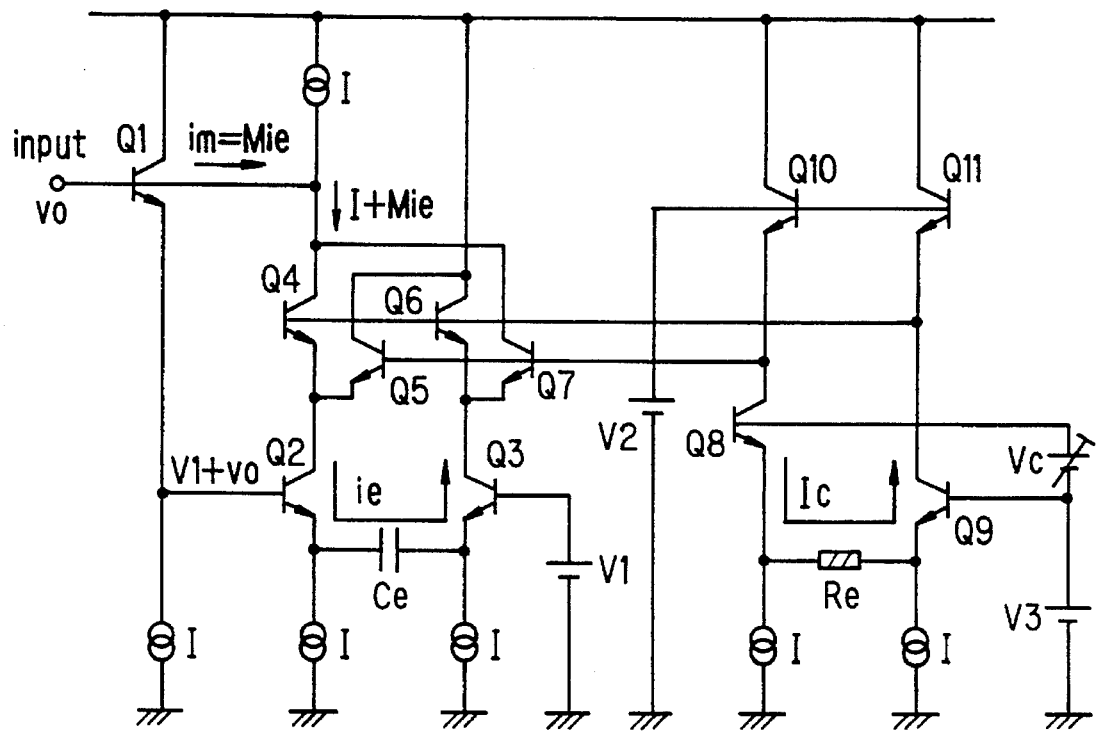
FIG. 3 is a circuit diagram showing an example of a specific structure of the voltage-variable capacitor circuit in FIG. 1.

The second oscillating loop 2 is also formed in the same way so that an output voltage vo2 and an oscillating frequency f2 are obtained. Here, the voltage-variable capacitors 1 and 11 are constructed in the same way as shown, for example, in FIG. 3. In this diagram, the input voltage vo is input to the differential pair comprising transistors Q2 and Q3 via the buffer comprising the transistor Q1. This input voltage vo will then become the current ie which will have been phase-shifted 90° by the capacitor Ce which goes across the emitters. This current ie depends on the fully-balanced pair comprising the transistors Q4 to Q7. The coefficient M (M<1) is then set in accordance with the magnitude of the control voltage Vc and the current Ic set by the resistor Re between the emitters of the differential pair comprising the transistors Q8 and Q9.

At this time, M is given by $$M = \frac{I_c}{I} = \frac{V_c}{IRe} \quad (2)$$

and the sum of the collector currents for the transistors Q4 and Q7 becomes I+Mie. The current I draining from a constant current source is subtracted from this and the current im (=Mie) is drawn into the input point. The characters V1 to V3 represent bypass power supplies.

Figure 4A:
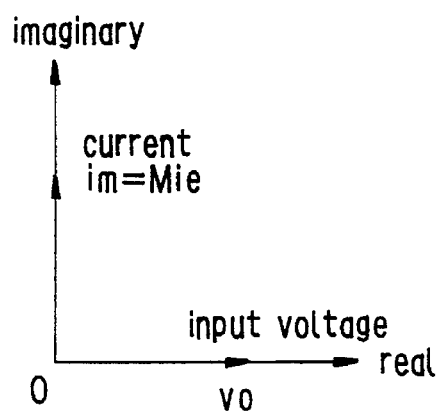
FIG. 4A and 4B shows the relationship between the input voltage vo and the current im, with FIG. 4(A) showing the phase relationship between the input voltage vo and the current im and FIG. 4(B) showing an alternative way of considering this situation.
Figure 4B:
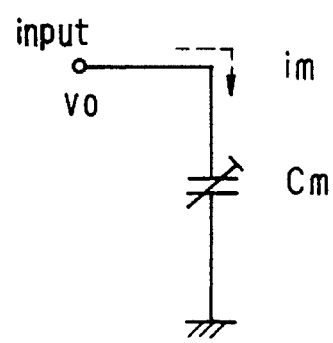

The phase relationship between the input voltage vo and the current im is shown in FIG. 4(a). This can be considered in the same way as the case in FIG. 4(b) where a capacitor is connected. Here, Cm becomes Cm=MCe ... (3), and the magnitude of M, i.e. the capacitance which depends on the control voltage Vc, can be varied.

Turning again to FIG. 1, a phase comparison is made of the two oscillating loop outputs vo1 and vo2 at a multiplier 5, unwanted high frequency components are taken out by an LPF (low pass filter) 6 to obtain a phase information voltage which then becomes the central voltage Vc through an amplifier 7. A PLL is constructed by feeding the voltage Vc and the voltage -KVc, which is K times the voltage Vc which has been inverted by being passed through a voltage control coefficient device 12, back to the voltage-variable capacitor 1 for the first oscillation loop and the voltage-variable capacitor 11 for the second oscillation loop as oscillating loop frequency control voltages. As a result of this, the oscillating frequencies f1 and f2 of the oscillating loops converge to become equal and the phase differences between the two become 90 degrees.

Figure 5A:
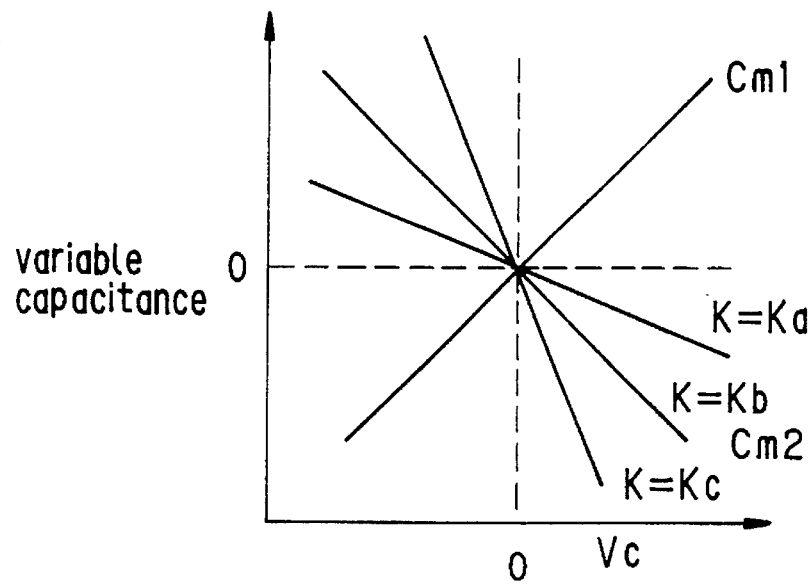
FIG. 5A and 5B shows the relationship between the variable capacitors Cm1 and Cm2 and the oscillating frequencies f1 and f2 with regards to the control voltage Vc.
Figure 5B:
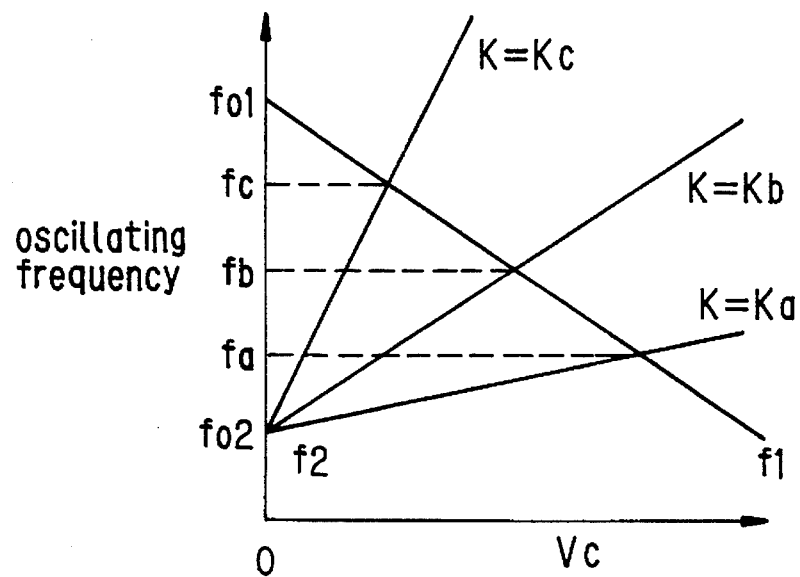

In this case, the relationship between the variable capacitors Cm1 and Cm2 and that between the oscillating frequencies f1 and f2 with regards to the control voltage Vc are such that since, as shown in FIG. 5, the slope of Cm2 varies depending on the control coefficient K for the voltage control coefficient device 12. If the oscillating frequencies when Vc=0 ( at this time, Cm1=Cm2=0) are taken to be fo1 and fo2 (where fo1>fo2), f1 and f2 intersect at a frequency between fo1 and fo2 and the loop converges at frequencies (fa, fb, fc) where f1=f2, with these frequencies becoming the oscillating frequencies. However, this can be set up depending on the control coefficient K for the voltage control coefficient device 12.

This voltage control coefficient device can be simply constructed within an IC by using resistance ratios and an arbitrary oscillating frequency can be obtained by selecting K appropriately. This can then be achieved using a circuit which has just two oscillators as external elements, with it then being possible to construct everything else that remains within the IC. Therefore, whereas with multi-system compatible televisions for the related art a plurality of resonators of a variety of frequencies were necessary to obtain a plurality of reference oscillation frequencies, this can be achieved with the circuit in this embodiment using only two, without the need of additional adjustment processes. Board surface area can therefore be reduced as a result of the decrease in the number of parts and the cost can also therefore be reduced.

Figure 6:
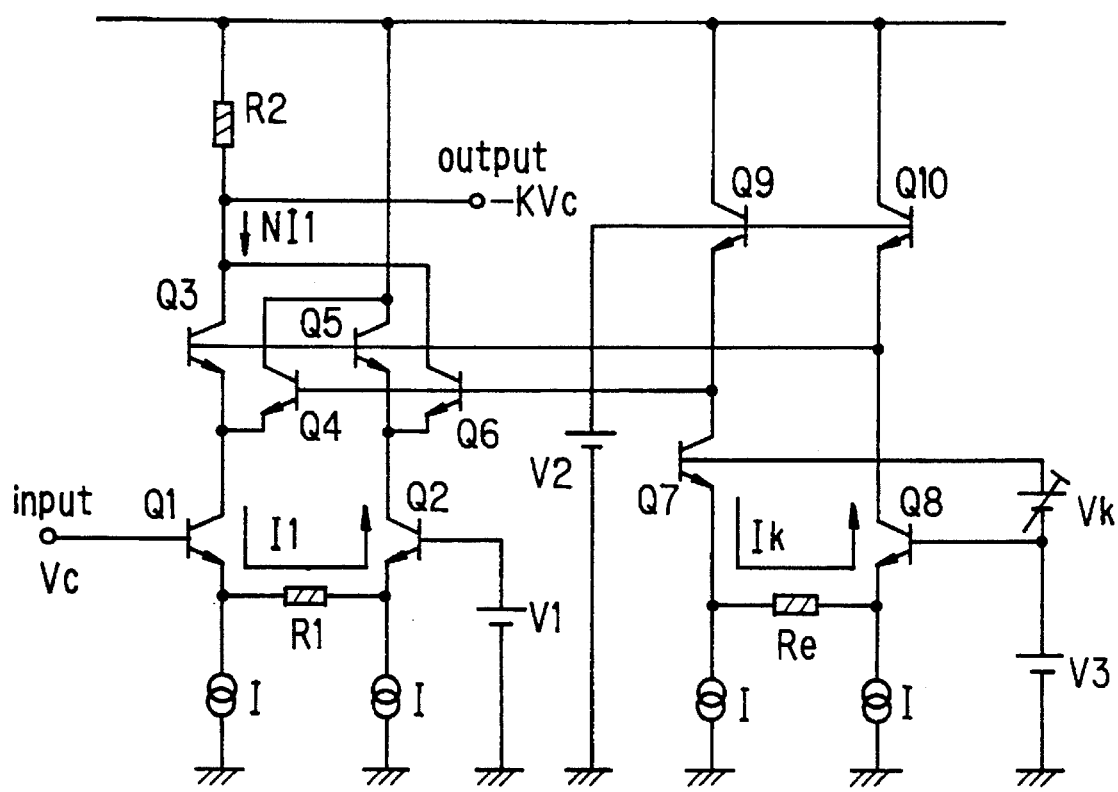
FIG. 6 shows an example of a specific circuit for a voltage control coefficient device.

FIG. 6 shows an example of a specific circuit for a voltage control coefficient device. The control coefficient K for the voltage control coefficient device in the reference frequency oscillator according to the instant embodiment can therefore be successively changed by a DC voltage by using this circuit. The following is a description of the operation of this circuit.

The input voltage Vc is converted to the current I1 by the resistor R1 placed between the emitters of the differential pair comprising the transistors Q1 and Q2. This is then multiplied by a factor of N (N<1) at the fully balanced pair comprising the transistors Q3 to Q6 in response to the size of the current Ik. This current Ik is determined by the control voltage Vk and the resistance Re placed across the emitters of the differential pair comprising the transistors Q7 and Q8. At this time, N is given by $$N = \frac{Ik}{I} = \frac{Vk}{IRe} \quad (3)$$

The current flowing through the resistance R2 then becomes N×I1 and the output voltage becomes −KVc.

K then becomes $$K = \frac{R2}{R1} N = \frac{R2}{R1} \frac{Vk}{IRe} \quad (4)$$

The gain, which depends on the resistance ratio of R1 and R2, is then consecutively varied by the control voltage Vk.

Figure 7A:
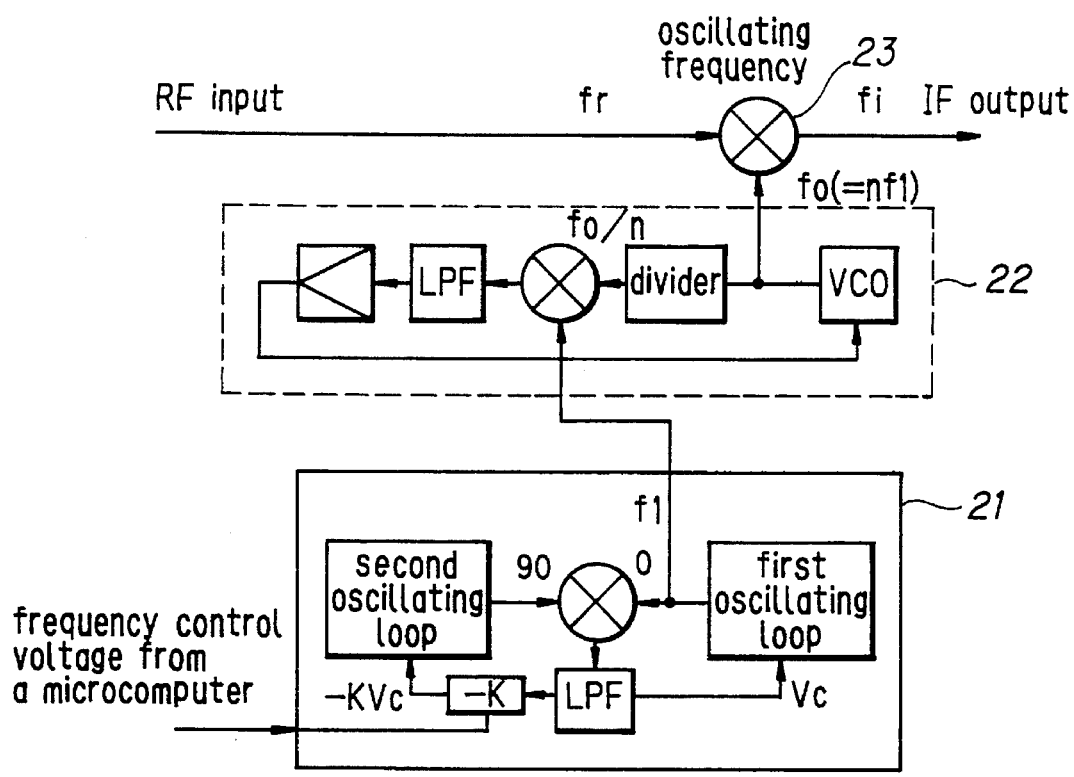
FIG. 7A and 7B is a block diagram showing an example of a structure of a synthesizer tuner circuit of this invention.
Figure 7B:
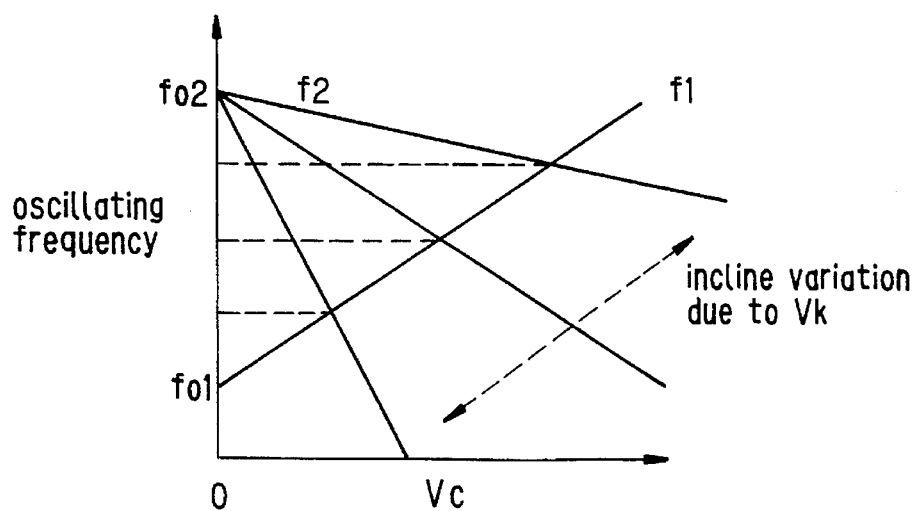

FIG. 7 is a diagram showing the structure of a synthesizer tuner circuit constructed using this coefficient circuit and the oscillating frequency for the reference frequency oscillator. As shown in FIG. 7(b), the control voltage of the control coefficient K of the reference frequency oscillator 21 is provided by a microcomputer so that a reference oscillating frequency is set up. A loop at a frequency synchronous loop circuit 22 is made so that a frequency which is the VCO oscillating frequency divided by 1/n coincides with a reference oscillating frequency f1 of a reference frequency oscillator 21, with the VCO oscillating frequency being set up at an appropriate frequency fo. Then, a tuner circuit is constructed so that, at a frequency converter 23, the RF input frequency fr is converted into fo and a difference frequency fi, with this then becoming the IF output.

Figure 8A:
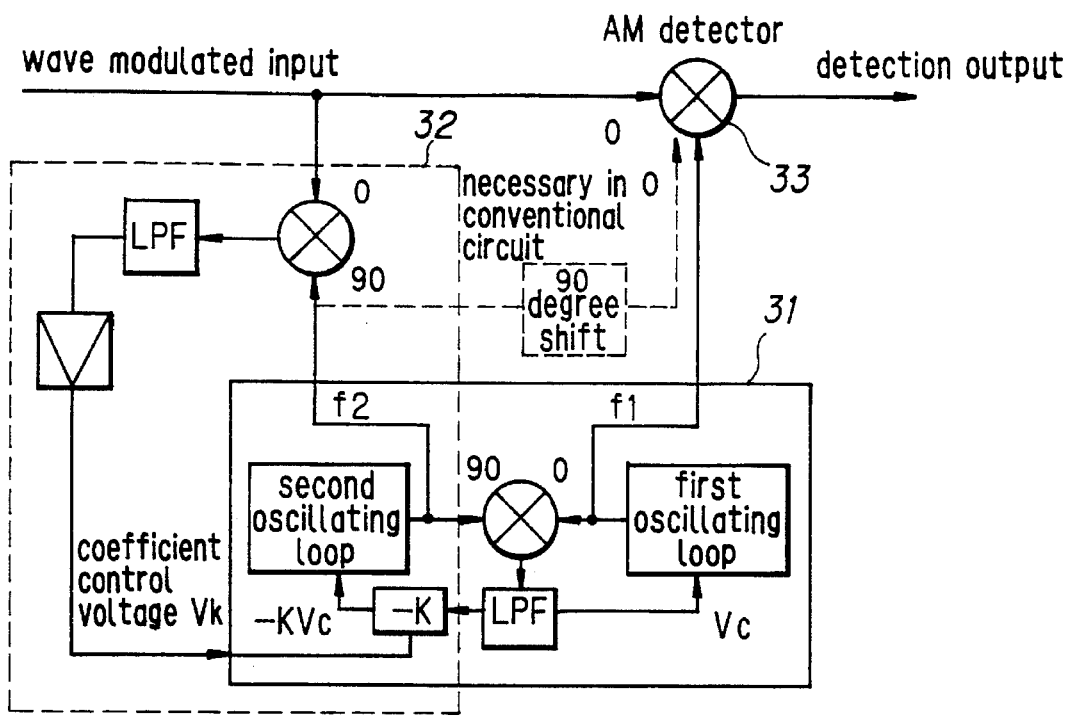
FIG. 8A, 8B and 8C is a block diagram showing an example of the structure of an AM synchronous circuit according to this invention.
Figure 8B:
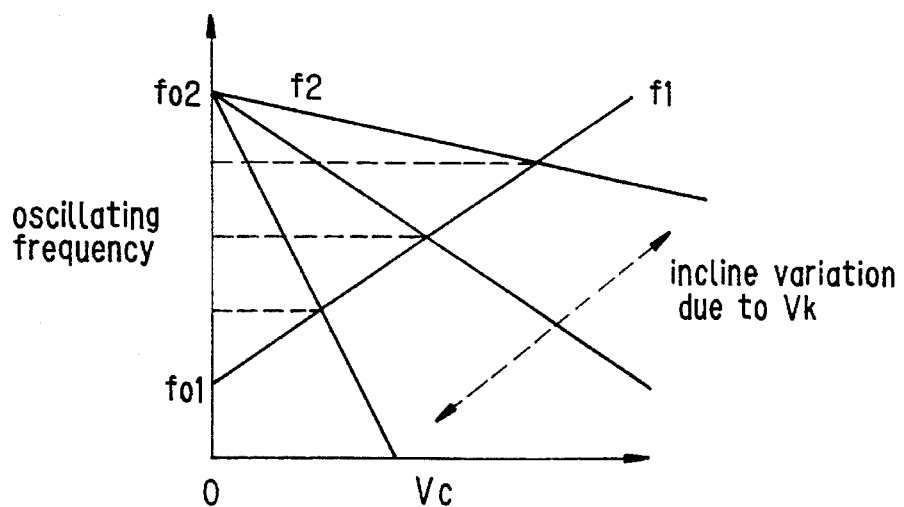
Figure 8C:
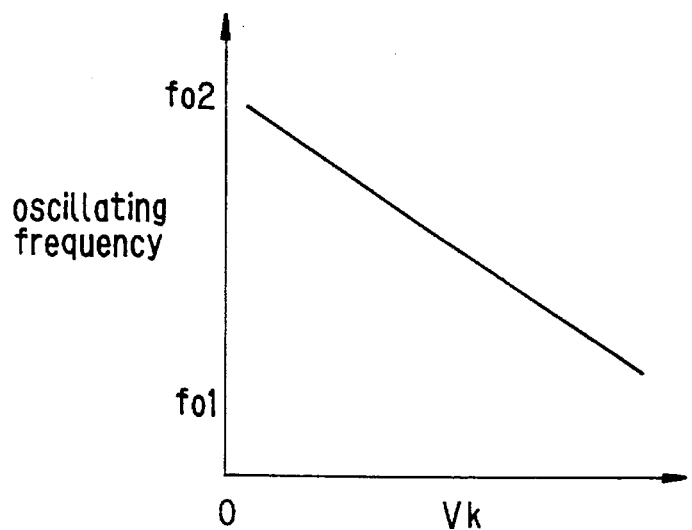
Figure 9:
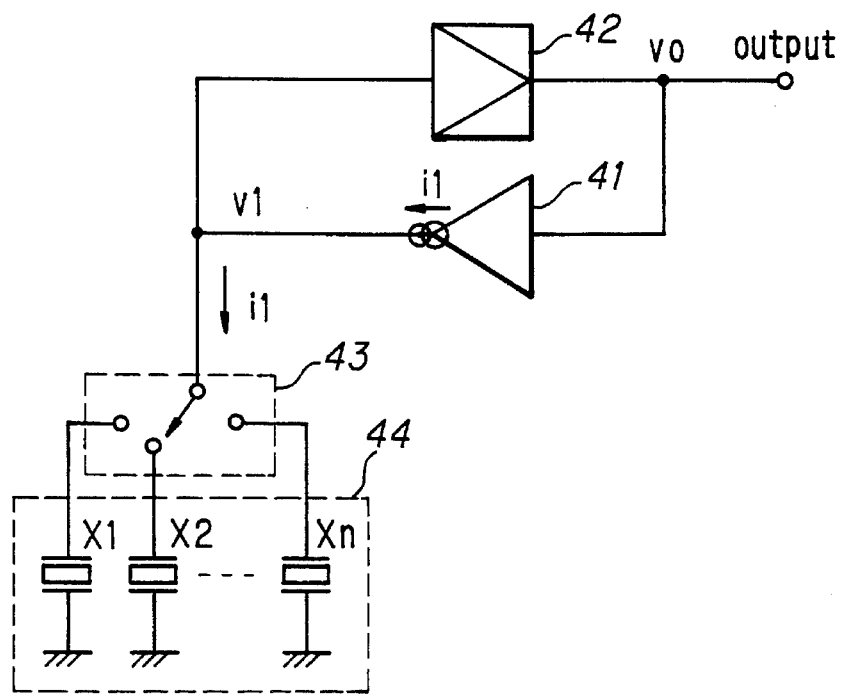
FIG. 9 is a block diagram showing the structure of a conventional reference frequency oscillator.

FIG. 8 is a diagram showing the structure of an AM synchronous detection circuit constructed using the voltage control coefficient device in FIG. 6 and the oscillating frequency of the reference frequency oscillator. In this diagram, a PLL circuit 32 is constructed so that a coefficient control voltage Vk is fed back to a second oscillation loop in such a manner that the oscillating frequency of a reference frequency oscillator 31 coincides with a modulated wave input frequency (IF). Further, an AM detection output is obtained by multiplying a first oscillating loop oscillator output and a modulated wave input together at an AM detector 33 in the state of zero phase difference. It therefore follows that if this AM synchronous detect circuit is adopted in a multi-system television receiver, signal receiving is possible with only two resonators and without the need for adjustment processes.

As the second oscillating loop is of a PLL construction, the phase difference between the output of the first oscillating loop and the modulated wave input is 90 degrees, so that the first oscillating loop is out of phase by 90 degrees with respect to the second oscillating loop. Therefore, in the circuit in this embodiment, two oscillating loop outputs are of the same frequency and have a phase difference of 90 degrees. The circuit structure can therefore be simplified by not using the shifting circuits which were used to shift the PLL circuit output signals by 90 degrees in the related art. It is therefore also possible to reduce both the circuit scale and the parts costs.

Also, removing the AM detector 33 in FIG. 8 and taking the output for the amplifier within the PLL circuit 32 as the demodulation output will give an FM synchronous detection circuit.

What is claimed is:

1. An oscillator outputting a plurality of signals of differing frequencies, comprising:

first oscillating means oscillating at a desired frequency in response to a voltage from a first resonator and first voltage-variable capacitor connected in parallel to a first current feedback loop of a first amplifier for controlling a voltage applied to the first voltage-variable capacitor;

second oscillating means oscillating at a desired frequency in response to a voltage from a second resonator and second voltage-variable capacitor connected in parallel to a second current feedback loop of a second amplifier for controlling a voltage applied to the second voltage variable capacitor;

voltage generating means for generating the voltage applied to the first voltage-variable capacitor and the voltage applied to the second voltage-variable capacitor by comparing an output of the first oscillating means and an output of the second oscillating means; and control means for making an oscillating frequency of the first oscillating means and an oscillating frequency of the second oscillating means coincide in a phase-locked loop constructed such that the polarities of the voltages applied to the first and second voltage-variable capacitors are different.

2. The oscillator according to claim 1, wherein a control coefficient of the voltage applied to the second voltage-variable capacitor is variable.

3. The oscillator according to claim 2, wherein the second voltage-variable capacitor comprises a differential transistor pair.

4. The oscillator according to claim 3, wherein a phase circuit is formed by connecting a capacitor between the emitters of the differential transistor pair in the second voltage-variable capacitor.

5. A synthesizer/tuner having an oscillator outputting a plurality of signals of differing frequencies, comprising:

first oscillating means oscillating at a desired frequency in response to a voltage from a first resonator and first voltage-variable capacitor connected in parallel to a first current feedback loop of a first amplifier for controlling a voltage applied to the first voltage-variable capacitor;

second oscillating means, oscillating at a desired frequency in response to a voltage from a second resonator and second voltage-variable capacitor connected in parallel to a second current feedback loop of a second amplifier for controlling a voltage applied to the second voltage variable capacitor;

voltage generating means for generating the voltage applied to the first voltage-variable capacitor and the voltage applied to the second voltage-variable capacitor by comparing an output of the first oscillating means and an output of the second oscillating means;

control means for making an oscillating frequency of the first oscillating means and an oscillating frequency of the second oscillating means coincide in a phase-locked loop constructed such that the polarities of the voltages applied to the first and second voltage-variable capacitors are different;

a frequency synchronous loop circuit for generating a signal synchronous with the oscillating frequency of the control means; and a frequency converter for converting the frequency of an RF input thereto in response to a signal output from the frequency synchronous loop circuit.

6. The synthesizer/tuner according to claim 5, wherein a control coefficient of the voltage applied to the second voltage-variable capacitor is variable.

7. The synthesizer/tuner according to claim 6, wherein the second voltage-variable capacitor comprises a differential transistor pair.

8. The synthesizer/tuner according to claim 7, wherein a phase circuit is formed by connecting a capacitor between respective emitters of the differential transistor pair in the second voltage-variable capacitor.

9. An AM synchronous detect circuit having an oscillator outputting a plurality of signals of differing frequencies, comprising:

first oscillating means oscillating at a desired frequency in response to a voltage from a first resonator and first voltage-variable capacitor connected in parallel to a first current feedback loop of a first amplifier for controlling a voltage applied to the first voltage-variable capacitor;

second oscillating means, oscillating at a desired frequency in response to a voltage from a second resonator and second voltage-variable capacitor connected in parallel to a second current feedback loop of a second amplifier for controlling a voltage applied to the second voltage variable capacitor;

voltage generating means for generating the voltage applied to the first voltage-variable capacitor and the voltage applied to the second voltage-variable capacitor by comparing an output of the first oscillating means and an output of the second oscillating means; and control means for making an oscillating frequency of the first oscillating means and an oscillating frequency of the second oscillating means coincide in a phase-locked loop constructed such that the polarities of the voltages applied to the first and second voltage-variable capacitors are different;

a frequency synchronous loop circuit for generating a signal synchronous with the oscillating frequency of the control means;

a frequency converter for converting the frequency of an RF input thereto in response to a signal output from the frequency synchronous loop circuit;

a PLL circuit operating such that the phase of an output and the phase of a wave modulated input for the second oscillating means coincide; and AM detector means for detecting the wave modulated input in response to the output of the first oscillating means.

10. The AM synchronous detect circuit according to claim 9, wherein a control coefficient of the voltage applied to the second voltage-variable capacitor is variable.

11. The AM synchronous detect circuit according to claim 10, wherein the second voltage-variable capacitor comprises a differential transistor pair.

12. The AM synchronous detect circuit according to claim 11, wherein a phase circuit is formed by connecting a capacitor between respective emitters of the differential transistor pair in the second voltage-variable capacitor.

* * * * *